(12) United States Patent
Chang

(10) Patent No.: US 7,505,282 B2
(45) Date of Patent: Mar. 17, 2009

(54) LAMINATED BOND OF MULTILAYER CIRCUIT BOARD HAVING EMBEDDED CHIPS

(75) Inventor: Roger Chang, Taoyuan Hsien (TW)

(73) Assignee: Mutual-TEK Industries Co., Ltd., Hsin Chuang, Taipei Hsien (TW)

( * ) Notice: Subject to any disclaimer, the term of this patent is extended or adjusted under 35 U.S.C. 154(b) by 265 days.

(21) Appl. No.: 11/589,889

(22) Filed: Oct. 31, 2006

(65) Prior Publication Data

US 2008/0101044 A1 May 1, 2008

(51) Int. Cl.
*H05K 1/18* (2006.01)
(52) U.S. Cl. .......... 361/761; 361/763
(58) Field of Classification Search .......... 361/761, 361/762, 763; 174/260
See application file for complete search history.

(56) References Cited

U.S. PATENT DOCUMENTS

| | | | |
|---|---|---|---|
| 6,538,210 B2* | 3/2003 | Sugaya et al. | 174/258 |
| 6,724,638 B1* | 4/2004 | Inagaki et al. | 361/763 |
| 6,734,542 B2* | 5/2004 | Nakatani et al. | 257/687 |
| 2008/0137314 A1* | 6/2008 | Salama et al. | 361/761 |

* cited by examiner

*Primary Examiner*—Dean A. Reichard
*Assistant Examiner*—Yuriy Semenenko
(74) *Attorney, Agent, or Firm*—Muncy, Geissler, Olds, & Lowe, PLLC

(57) ABSTRACT

A multilayer circuit board has a bottom and an upper multilayer circuit boards, a glue layer, multiple outer contact vias and two insulating lacquer layers. The bottom and the upper multilayer circuit boards respectively have multiple conductive wires, an insulating layer, a frame, multiple chips, a press laminate, a patterned conductive layer and at least one inner contact via. The glue layer sticks the bottom and the upper multilayer circuit boards together. The multiple contact vias are formed through the bottom and the upper multilayer circuit boards to electronically interconnect the conductive wires and the patterned conductive layers in the bottom and the upper multilayer circuit boards. The insulating lacquer layers are respectively coated under and on portions of the patterned conductive layers in the bottom and the upper multilayer circuit boards to protect the patterned conductive layers, wherein the un-coated patterned conductive layers become multiple contacts.

14 Claims, 6 Drawing Sheets

LAMINATED BOND OF MULTILAYER CIRCUIT BOARD HAVING EMBEDDED CHIPS

BACKGROUND OF THE INVENTION

1. Field of the Invention

The present invention relates to a multilayer circuit board, and more particularly to a combined multilayer circuit board having chips embedded therein.

2. Description of Related Art

Passive elements, such as resistors or capacitors, are mounted upon the conventional circuit boards, such as motherboards or printed circuit boards. However, the advancement of semiconductor technology has resulted in electronic products being smaller and more multi-function. More functions the circuit boards have, more passive elements are necessary. Smaller size and multi-function electronic produces are in opposite positions.

To make the circuit board having more multi-functions but being smaller, the present invention provides a combined multilayer circuit board having chips embedded therein to mitigate or obviate the aforementioned problems.

SUMMARY OF THE INVENTION

The main objective of the invention is to provide a combined multilayer circuit board having chips embedded therein.

A multilayer circuit board in accordance with the present invention comprises a bottom multilayer circuit board, an upper multilayer circuit board, a glue layer, multiple outer contact vias and two insulating lacquer layers. The bottom multilayer circuit board comprises multiple conductive wires, an insulating layer, a frame, multiple chips, a press laminate, a patterned conductive layer and at least one inner contact via. The insulating layer is formed under and covers parts of the conductive wires. The frame is mounted under the insulating layer and has multiple enclosures. The chips are mounted under the insulating layer, are respectively enclosed by one enclosure and are respectively electronically connected to the exposed conductive wires. The press laminate is formed under the frame and in the enclosures to encapsulate the chips. The patterned conductive layer is adhered under the frame by the press laminate. Each inner contact via is formed through the conductive wires, the insulating layer, the frame, the press laminate and the patterned conductive layer to electronically connect the conductive wires to the patterned conductive layer. The upper multilayer circuit board is mounted on the bottom multilayer circuit board and comprises multiple conductive wires, an insulating layer, a frame, multiple chips, a press laminate, a patterned conductive layer and at least one inner contact via. The insulating layer in the upper multilayer circuit board is formed on and covers parts of the conductive wires in the upper multilayer circuit board. The frame in the upper multilayer circuit board is mounted on the insulating layer in the upper multilayer circuit board and has multiple enclosures. The chips in the upper multilayer circuit board are mounted on the insulating layer, are respectively enclosed by one enclosure and are respectively electronically connected to the exposed conductive wires in the upper multilayer circuit board. The press laminate in the upper multilayer circuit board is formed on the frame and in the enclosures to encapsulate the chips in the upper multilayer circuit board. The patterned conductive layer is adhered to the frame by the press laminate in the upper multilayer circuit board. Each inner contact via in the upper multilayer circuit board is formed through the conductive wires, the insulating layer, the frame, the press laminate and the patterned conductive layer to electronically connect the conductive wires to the patterned conductive layer. The glue layer is formed between and sticks the bottom and the upper multilayer circuit boards together. The multiple contact vias are formed through the bottom and the upper multilayer circuit boards to electronically interconnect the conductive wires and the patterned conductive layers in the bottom and the upper multilayer circuit boards. The insulating lacquer layers are respectively coated under portions of the patterned conductive layer in the bottom multilayer circuit board and on portions of the patterned conductive layer in the upper multilayer circuit board to protect the patterned conductive layers, wherein the un-coated patterned conductive layers become multiple contacts.

Other objectives, advantages and novel features of the invention will become more apparent from the following detailed description when taken in conjunction with the accompanying drawings.

DETAILED DESCRIPTION OF PREFERRED EMBODIMENT

Figure 1:
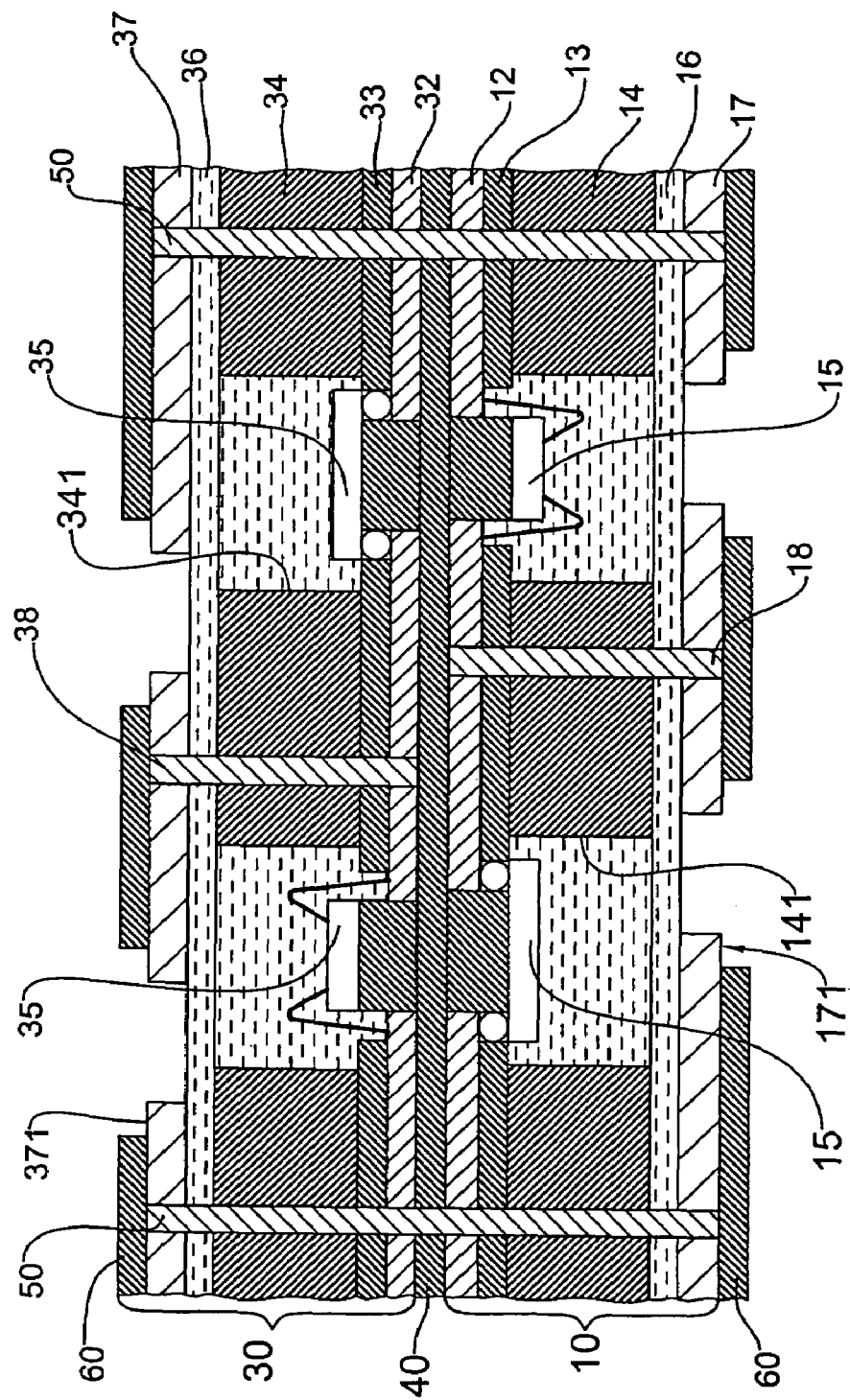
FIG. 1 is a side view in partial section of a first embodiment of a combined multilayer circuit board in accordance with the present invention.

With reference to FIGS. 1-4, a combined multilayer circuit board having chips embedded therein in accordance with the present invention comprises a bottom multilayer circuit board (10), at least one optional middle multilayer circuit board (20), an upper multilayer circuit board (30), at least one glue layer (40), multiple outer contact vias (50) and two insulating lacquer layers (60).

The bottom multilayer circuit board (10) comprises an optional substrate (11), multiple conductive wires (12), an insulating layer (13), a frame (14), multiple chips (15), a press laminate (16), a patterned conductive layer (17) and at least one inner contact via (18).

Figure 3:
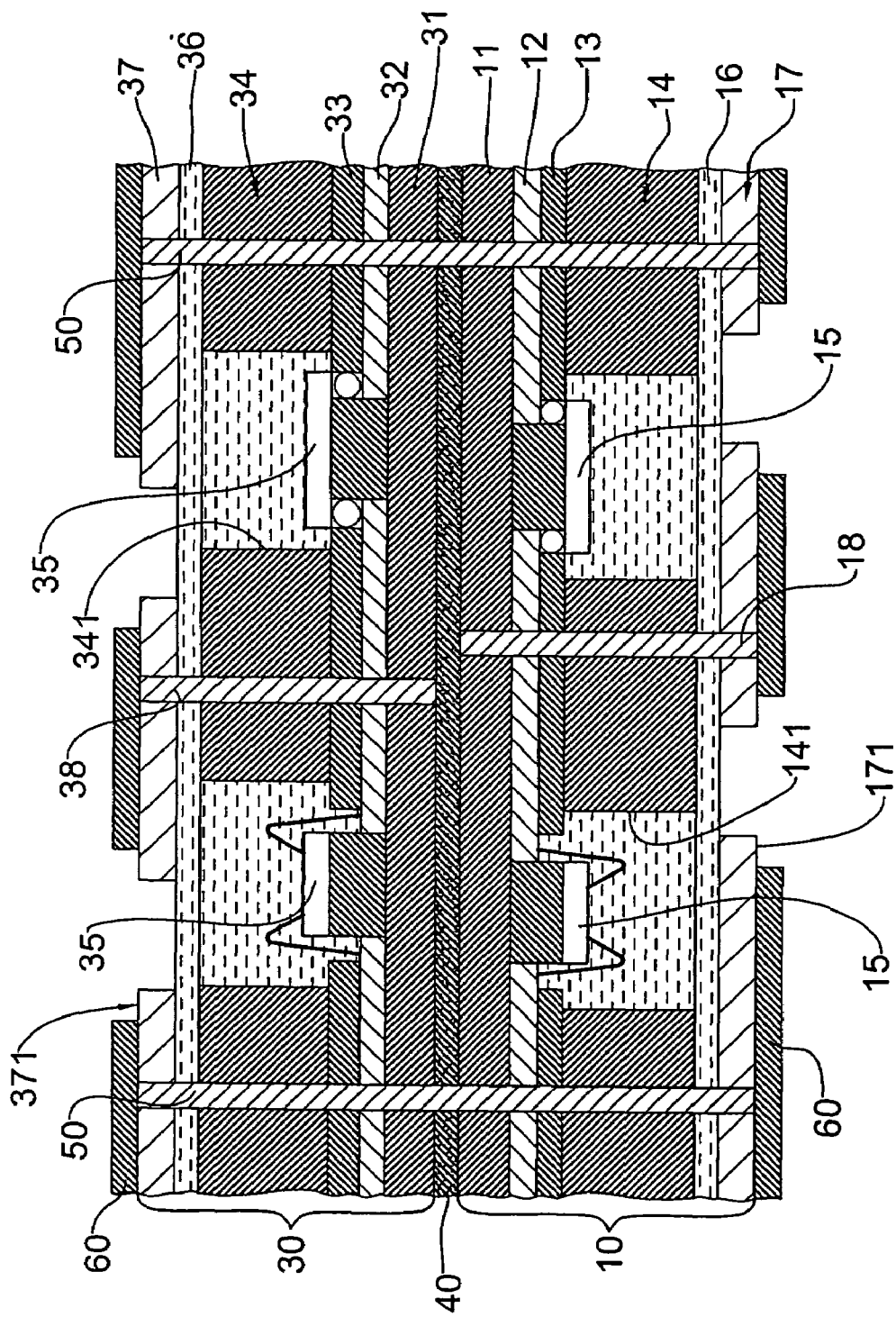
FIG. 3 is a side view in partial section of a third embodiment of a combined multilayer circuit board in accordance with the present invention.

The substrate (11) may be a FR4 substrate. The conductive wires (12) may be formed under the substrate (11) as shown in FIG. 3. The insulating layer (13) is formed under and covers parts of the conductive wires (12). The frame (14) is mounted under the insulating layer (13) and has multiple enclosures (141). The chips (15) are mounted under the insulating layer (13), are respectively enclosed by one enclosure (141) and are respectively electronically connected to the exposed conductive wires (12) by wire bonding or solder bump bonding. The press laminate (16) is formed on the frame (14) and in the enclosures (141) to encapsulate the chips (15). The patterned conductive layer (17) is adhered under the frame (14) by the press laminate (16). Each inner contact via (18) is formed through the conductive wires (12), the insulating layer (13), the frame (14), the press laminate (16) and the patterned conductive layer (17) to electronically connect the conductive wires (12) to the patterned conductive layer (17).

Figure 4:
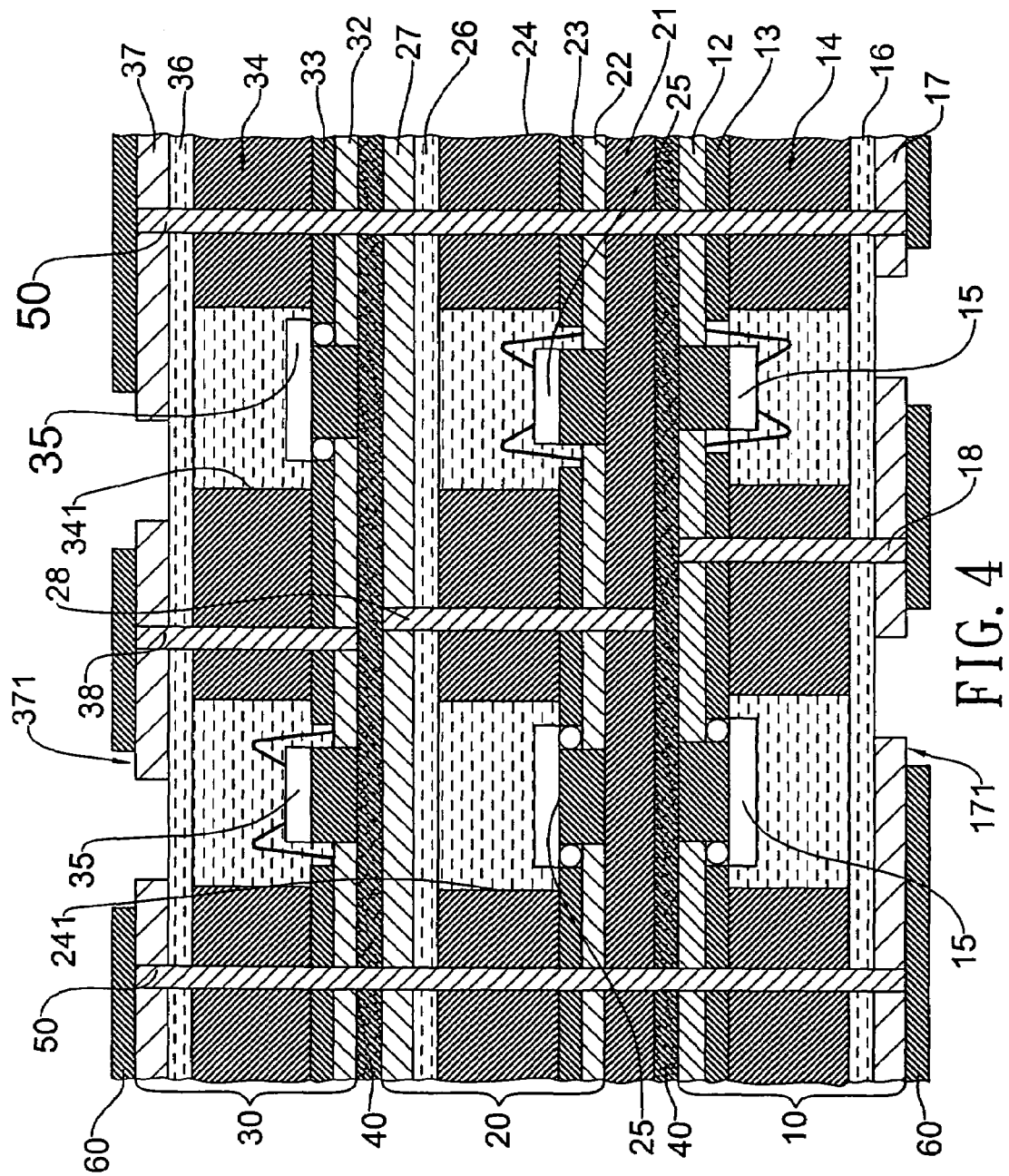
FIG. 4 is a side view in partial section of a fourth embodiment of a combined multilayer circuit board with a middle multilayer circuit board.

With reference to FIG. 4, the middle multilayer circuit board (20) is formed on the bottom multilayer circuit board (10) and comprises an optional substrate (21), multiple conductive wires (22), an insulating layer (23), a frame (24), multiple chips (25), a press laminate (26), a patterned conductive layer (27) and at least one inner contact via (28).

The substrate (21) may be a FR4 substrate and is mounted on the bottom multilayer circuit board (10). The conductive wires (22) may be formed on the substrate (21) as shown in FIG. 4. The insulating layer (23) is formed on and covers parts of the conductive wires (22). The frame (24) is mounted on the insulating layer (23) and has multiple enclosures (241). The chips (25) are mounted on the insulating layer (23), are respectively enclosed by one enclosure (241) and are respectively electronically connected to the exposed conductive wires (22) by wire bonding or solder bump bonding. The press laminate (26) is formed on the frame (24) and in the enclosures (241) to encapsulate the chips (25). The patterned conductive layer (27) is adhered on the frame (24) by the press laminate (26). Each inner contact via (28) is formed through the conductive wires (22), the insulating layer (23), the frame (24), the press laminate (26) and the patterned conductive layer (27) to electronically connect the conductive wires (22) to the patterned conductive layer (27).

Figure 2:
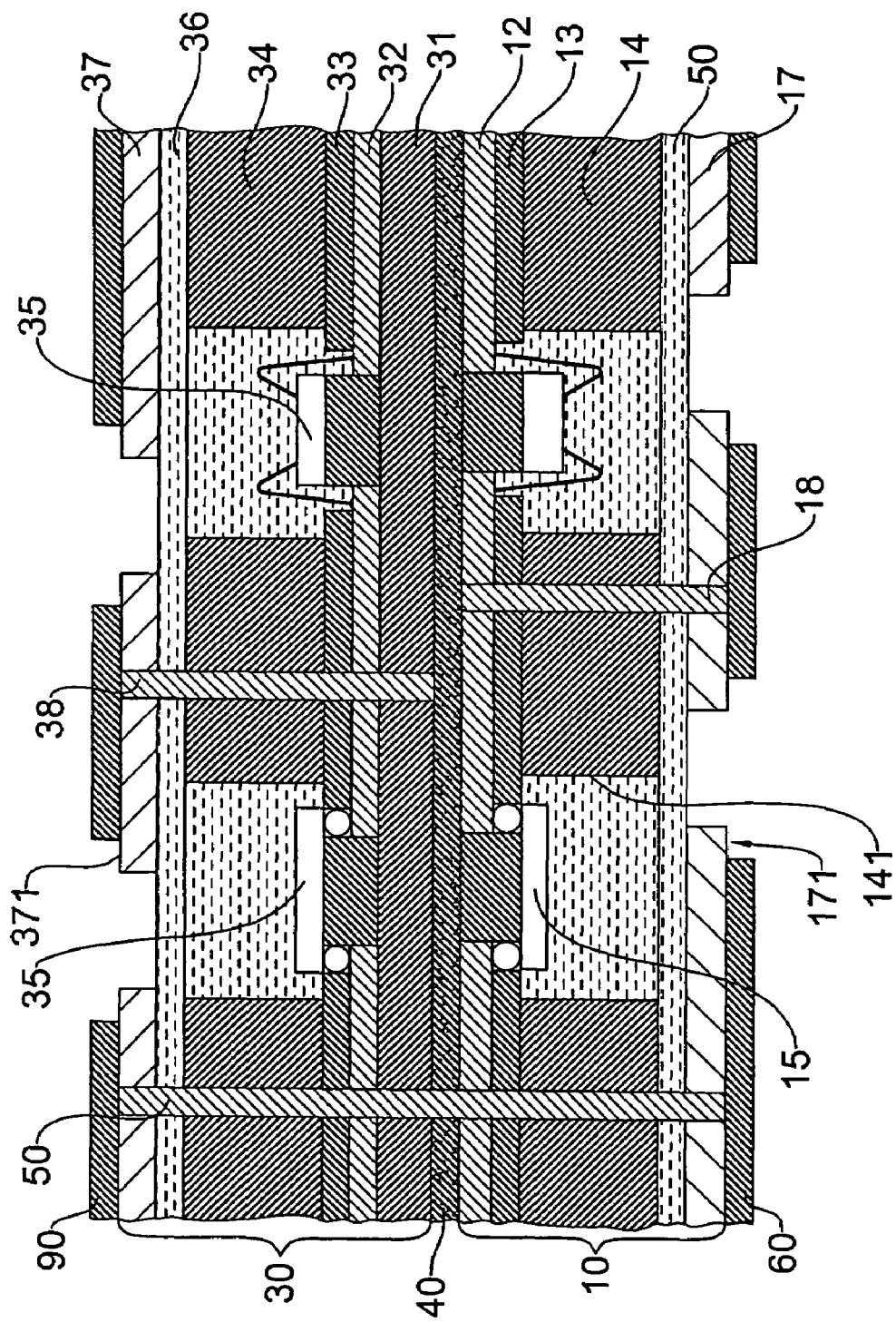
FIG. 2 is a side view in partial section of a second embodiment of a combined multilayer circuit board in accordance with the present invention.

The upper multilayer circuit board (30) is mounted on the bottom multilayer circuit board (10) as shown in FIGS. 1-3 or on the middle multilayer circuit board (20) in FIG. 4 and comprises an optional substrate (31), multiple conductive wires (32), an insulating layer (33), a frame (34), multiple chips (35), a press laminate (36), a patterned conductive layer (37) and at least one inner contact via (38).

The substrate (31) may be a FR4 substrate and is mounted on the bottom multilayer circuit board (10) as shown in FIGS. 2 and 3 or on the middle multilayer circuit board (20) in FIG. 4. The conductive wires (32) may be formed on the substrate (31) as shown in FIGS. 2 and 3. The insulating layer (33) is formed on and covers parts of the conductive wires (32). The frame (34) is mounted on the insulating layer (33) and has multiple enclosures (341). The chips (35) are mounted on the insulating layer (33), are respectively enclosed by one enclosure (341) and are respectively electronically connected to the exposed conductive wires (32) by wire bonding or solder bump bonding. The press laminate (36) is formed on the frame (34) and in the enclosures (341) to encapsulate the chips (35). The patterned conductive layer (37) is adhered to the frame (34) by the press laminate (36). Each inner contact via (38) is formed through the conductive wires (32), the insulating layer (33), the frame (34), the press laminate (36) and the patterned conductive layer (37) to electronically connect the conductive wires (32) to the patterned conductive layer (37).

Each glue layer (40) is formed between two multilayer circuit boards (10, 20, 30) to stick the two multilayer circuit boards (10, 20, 30) together.

The outer contact vias (50) are formed through the multilayer circuit boards (10, 20, 30) to electronically interconnect the conductive wires (12, 22, 32) and the patterned conductive layers (17, 27, 37) in the multilayer circuit boards (10, 20, 30).

Figure 5:
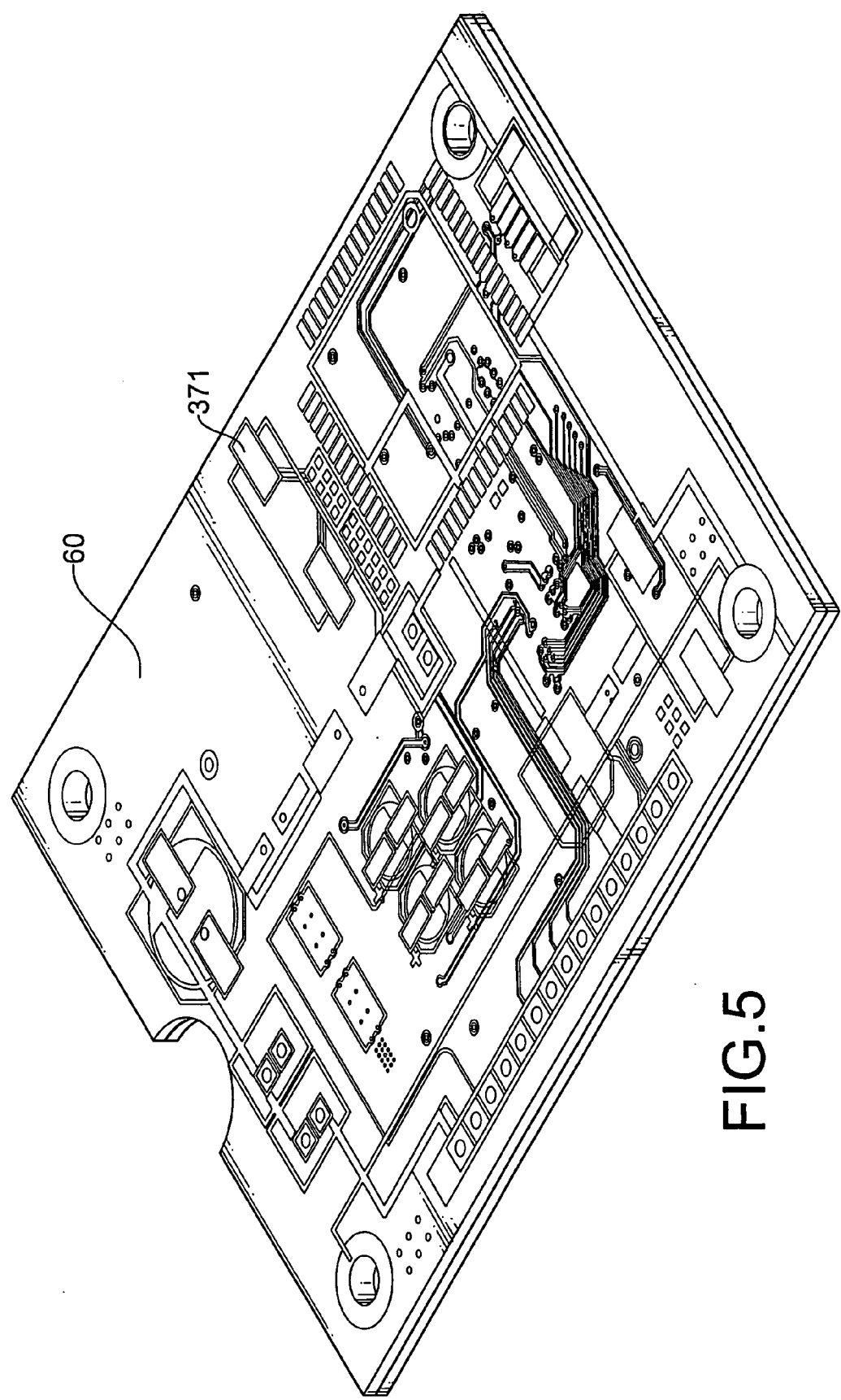
FIG. 5 is a perspective view of the combined multilayer circuit board as shown in FIG. 1.
Figure 6:
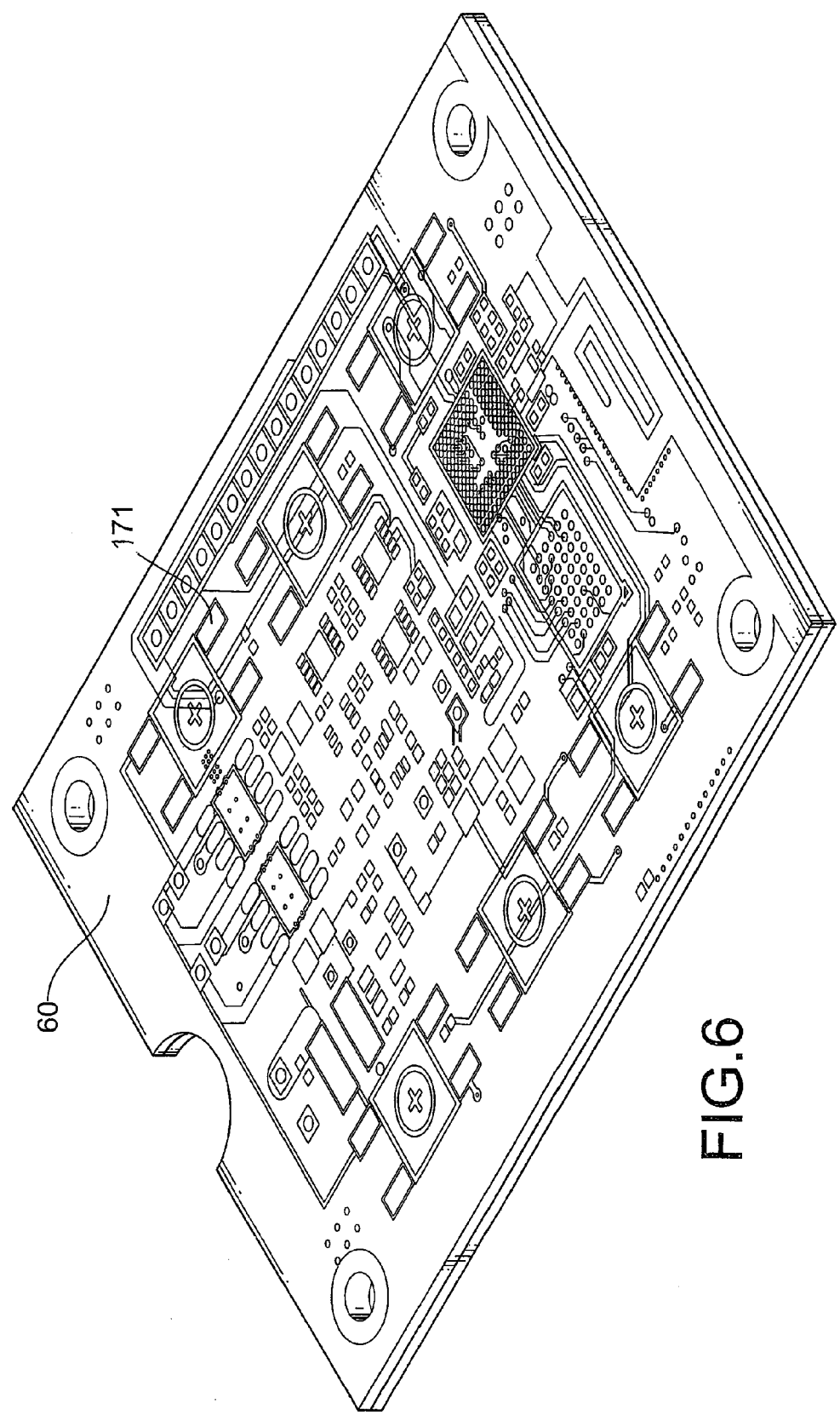
FIG. 6 is a reverse perspective view of the combined multilayer circuit board as shown in FIG. 5.

The insulating lacquer layers (60) are respectively coated under portions of the patterned conductive layer (17) in the bottom multilayer circuit board (10) and on portions of the patterned conductive layer (37) in the upper multilayer circuit board (30) to protect the patterned conductive layers (17, 37). With further reference to FIGS. 5 and 6, the un-coated patterned conductive layers (17, 37) become multiple contacts (171, 371). Therefore, a combined multilayer circuit board having embedded chips is finished.

Such a combined multilayer circuit board is not only a circuit board, but also a circuit board has multiple chips embedded in. The combined circuit board can be a motherboard, a printed circuit board or the like. Therefore, most of the passive elements are able to be mounted in the combined circuit board. Furthermore, the combined multilayer circuit board in accordance with the present invention provides more multi-functions than the conventional circuit board but without lager size.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A laminated bond of multilayer circuit board having embedded chips comprising
a bottom multilayer circuit board comprising
multiple conductive wires;
an insulating layer formed under and covering parts of the conductive wires;
a frame mounted under the insulating layer and having multiple enclosures;
multiple chips mounted under the insulating layer, being respectively enclosed by one enclosure and respectively electronically connected to the exposed conductive wires;
a press laminate formed on the frame and in the enclosures to encapsulate the chips;
a patterned conductive layer adhered under the frame by the press laminate; and
at least one inner contact via formed through the conductive wires, the insulating layer, the frame, the press laminate and the patterned conductive layer to electronically connect the conductive wires to the patterned conductive layer;
an upper multilayer circuit board mounted on the bottom multilayer circuit board and comprising
multiple conductive wires;
an insulating layer formed on and covering parts of the conductive wires in the upper multilayer circuit board;
a frame mounted on the insulating layer in the upper multilayer circuit board and having multiple enclosures;
multiple chips mounted on the insulating layer in the upper multilayer circuit board, respectively enclosed by one enclosure in the upper multilayer circuit board and respectively electronically connected to the exposed conductive wires in the upper multilayer circuit board;
a press laminate formed on the frame and in the enclosures in the upper multilayer circuit board to encapsulate the chips in the upper multilayer circuit board;
a patterned conductive layer adhered to the frame by the press laminate in the upper multilayer circuit board; and
at least one inner contact via formed through the conductive wires, the insulating layer, the frame, the press laminate and the patterned conductive layer to electronically connect the conductive wires to the patterned conductive layer in the upper multilayer circuit board;

a glue layer formed between and sticking the bottom and the upper multilayer circuit boards together;

multiple contact vias formed through the bottom and the upper multilayer circuit boards to electronically interconnect the conductive wires and the patterned conductive layers in the bottom and the upper multilayer circuit boards; and two insulating lacquer layers respectively coated under portions of the patterned conductive layer in the bottom multilayer circuit board and on portions of the patterned conductive layer in the upper multilayer circuit board to protect the patterned conductive layers, wherein the uncoated patterned conductive layers become multiple contacts.

2. The laminated bond of multilayer circuit board as claimed in claim 1, wherein the bottom multilayer circuit board further comprises a substrate formed between the conductive wires in the bottom multilayer circuit board and the glue layer.

3. The laminated bond of multilayer circuit board as claimed in claim 2, wherein the substrate in the bottom multilayer circuit board is a FR4 substrate.

4. The laminated bond of multilayer circuit board as claimed in claim 1, wherein the chips in the bottom and the upper multilayer circuit boards are respectively electronically connected to the exposed conductive wires by wire bonding.

5. The laminated bond of multilayer circuit board as claimed in claim 1, wherein the chips in the bottom and the upper multilayer circuit boards are respectively electronically connected to the exposed conductive wires by solder bump bonding.

6. The laminated bond of multilayer circuit board as claimed in claim 1, wherein the upper multilayer circuit board further comprises a substrate formed between the conductive wires in the upper multilayer circuit board and the glue layer.

7. The laminated bond of multilayer circuit board as claimed in claim 6, wherein the substrate in the upper multilayer circuit board is a FR4 substrate.

8. The laminated bond of multilayer circuit board as claimed in claim 1 further comprising at least one middle multilayer circuit board adhered between the bottom and the upper multilayer circuit boards by multi glue layers, wherein each middle multilayer circuit board comprises multiple conductive wires;

an insulating layer formed on and covering parts of the conductive wires in the middle multilayer circuit board;

a frame mounted on the insulating layer in the middle multilayer circuit board and having multiple enclosures;

multiple chips mounted on the insulating layer, respectively enclosed by one enclosure and respectively electronically connected to the exposed conductive wires in the middle multilayer circuit board;

a press laminate formed on the frame and in the enclosures to encapsulate the chips in the middle multilayer circuit board;

a patterned conductive layer adhered on the frame by the press laminate in the middle multilayer circuit board; and at least one inner contact via formed through the conductive wires, the insulating layer, the frame, the press laminate and the patterned conductive layer to electronically connect the conductive wires to the patterned conductive layer in the middle multilayer circuit board.

9. The laminated bond of multilayer circuit board as claimed in claim 8, wherein the middle multilayer circuit board further comprises a substrate formed between the conductive wires in the middle multilayer circuit board and the glue layer.

10. The laminated bond of multilayer circuit board as claimed in claim 9, wherein the substrate in the middle multilayer circuit board is a FR4 substrate.

11. The laminated bond of multilayer circuit board as claimed in claim 8, wherein the chips in the middle multilayer circuit board are respectively electronically connected to the exposed conductive wires by wire bonding.

12. The laminated bond of multilayer circuit board as claimed in claim 8, wherein the chips in the middle multilayer circuit board are respectively electronically connected to the exposed conductive wires by solder bump bonding.

13. The laminated bond of multilayer circuit board as claimed in claim 8, wherein the outer contacts are further formed through the middle multilayer circuit board to electronically interconnects to the conductive wires and the patterned conductive layers in the bottom, the upper and the middle multilayer circuit boards.

14. The laminated bond of multilayer circuit board as claimed in claim 1, wherein un-coated patterned conductive layers in the bottom and the upper multilayer circuit boards become multiple contacts.

* * * * *